(12) United States Patent
Lim et al.

(10) Patent No.: US 8,278,173 B2
(45) Date of Patent: Oct. 2, 2012

(54) METHOD OF FABRICATING GATE STRUCTURES

(75) Inventors: Peng-Soon Lim, Johor (MY); Chia-Pin Lin, Hsinchu County (TW); Kuang-Yuan Hsu, Taichung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 108 days.

(21) Appl. No.: 12/827,512

(22) Filed: Jun. 30, 2010

(65) Prior Publication Data

US 2012/0001266 A1  Jan. 5, 2012

(51) Int. Cl.
*H01L 21/8234* (2006.01)
(52) U.S. Cl. .. 438/275; 438/276; 438/468; 438/E21.632
(58) Field of Classification Search .......... 438/268–270, 438/275–276, 468; 257/48, 263–267, 328–344, 257/365–368
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,371,644 B2 * | 5/2008 | Yagishita et al. | 438/268 |
| 7,508,031 B2 | 3/2009 | Liu et al. | |
| 7,528,465 B2 | 5/2009 | King et al. | |
| 7,605,449 B2 | 10/2009 | Liu et al. | |
| 7,859,065 B2 * | 12/2010 | Takeuchi et al. | 257/401 |
| 2005/0153490 A1 | 7/2005 | Yoon et al. | |
| 2006/0275988 A1 * | 12/2006 | Yagishita et al. | 438/275 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0258228 A1 | 10/2008 | Chuang et al. | |
| 2008/0263492 A1 | 10/2008 | Chuang et al. | |
| 2008/0290470 A1 | 11/2008 | King et al. | |
| 2008/0296632 A1 | 12/2008 | Moroz et al. | |

(Continued)

OTHER PUBLICATIONS

Bartlomiej Jan Pawlak, et al., U.S. Appl. No. 12/569,689, "Method of Fabricating Finfet Device,", filed Sep. 29, 2009, 21 pages.

(Continued)

*Primary Examiner* — Dung A. Le
(74) *Attorney, Agent, or Firm* — Haynes and Boone, LLP

(57) ABSTRACT

A method includes: forming first and second projections; forming a first structure engaging the first projection, and including: a non-metallic conductive layer, and a first opening over the conductive layer; forming a second structure engaging the second projection, and including: a second opening; and conformally depositing a pure metal in the first and second openings. A different aspect involves an apparatus including: a first device that includes a first projection and a first gate structure, the first projection extending from a substrate, and the first gate structure engaging the first projection, and including an opening, and a conformal, pure metal disposed in the opening; and a second device that includes a second projection and a second gate structure, the second projection extending from the substrate, and the second gate structure engaging the second projection, and including a silicide including a metal that is the same metal disposed in the opening.

14 Claims, 17 Drawing Sheets

U.S. PATENT DOCUMENTS

| | | |
|---|---|---|
| 2009/0035909 A1 | 2/2009 | Chang et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0203734 A1 | 8/2010 | Shieh et al. |
| 2010/0264468 A1 | 10/2010 | Xu |

OTHER PUBLICATIONS

Hsien-Hsin Lin, et al., U.S. Appl. No. 12/703,918, "Method for Fabricating a Finfet Device,", filed Feb. 11, 2010, 40 pages.

Chien-Chang Su, et al., U.S. Appl. No. 12/644,869, "Method for Incorporating Impurity Element in EPI Silicon Process,", filed Dec. 22, 2009, 21 pages.

Tsung-Lin Lee, et al., U.S. Appl. No. 12/622,038, "Sacrificial Offset Protection Film for a Finfet Device,", filed Nov. 19, 2009, 56 pages.

Jeff J. Xu, et al., U.S. Appl. No. 12/784,207, "Method of Forming EPI Film in Substrate Trench,", filed May 20, 2010, 33 pages.

Tian-Choy, et al., U.S. Appl. No. 12/756,552, "Hybrid Gate Process for Fabricating Finfet Device,", filed Apr. 8, 2010, 38 pages.

Ming-Lung Cheng, et al. U.S. Appl. No. 12/780,124, "Method and Apparatus for Enhancing Channel Strain,", filed May 14, 2010, 35 pages.

Jhon Jhy Liaw, U.S. Appl. No. 12/823,907, "Cell Structure for Dual-Port SRAM,", filed Jun. 25, 2010, 46 pages.

Jhon Jhy Liaw, U.S. Patent Application No. 12/827,406, "Rom Cell Circuit for Finfet Devices,", filed Jun. 30, 2010, 32 pages.

Jhon Jhy Liaw, U.S. Appl. No. 12/823,860, "Structure and Method for SRAM Cell Circuit,", filed Jun. 25, 2010, 37 pages.

Jhon Jhy Liaw, et al., U.S. Appl. No. 12/827,690, "Layout for Multiple-Fin SRAM Cell,", filed Jun. 30, 2010, 35 pages.

Jeng-Jung Shen, et al., U. S. Appl. No. 12,780,060, "Automatic Layout Conversion for Finfet Device,", filed May 14, 2010, 29 pages.

Jeng-Jung Shen, et al., U. S. Appl. No. 12/780,426, "Finfet Boundary Optimization,", filed May 14, 2010, 28 pages.

Yu-Lien Huang, et al., U. S. Appl. No. 12/840,830, "High Surface Dopant Concentration Semiconductor Device and Method of Fabricating,", filed Jul. 21, 2010, 21 pages.

Tsu-Hsiu Pemg, et al., U.S. Appl. No. 12/837,093, "Fin-Like Field Effect Transistor (Finfet) Device and Method of Manufacturing Same,", filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure,", filed Aug. 30, 2010, 30 pages.

Jeff J. Xu, et al, U.S. Appl. No. 12/906,820, "Fin-Like Field Effect Transistor (Finfet) Device and Method of Manufacturing Same,", filed Oct. 18, 2010, 55 pages.

Jeff J. Csu, et al, U.S. Appl. No. 12/917,902, "Fin-Like Field Effect Transistor (Finfet) Device and Method of Manufacturing Same,", filed Nov. 2, 2010, 61 pages.

Mark van Dal, U.S. Appl. No. 12/900,895, "Method of Fabricating a Semiconductor Device Having an Epitaxly Region,", filed Oct. 8, 2010, 21 pages.

Hsin-Chih Chen, et al, U.S. Appl. No. 12/907,272, "Multi-Fin Device by Self-Aligned Castle Fin Formation,", filed Oct. 19, 2010, 34 pages.

Chien-Hsun Wang, et al, U.S. Appl. No. 12/952,376, "Method for Adjusting Fin Width in Integrated Circuitry,", filed Nov. 23, 2010, 27 pages.

Chien-Shun Wang, et al, U.S. Appl. No. 12/949,881, "Method for Forming Metrology Structures From Fins in Integrated Circuitry,", filed Nov. 19, 2010, 16 pages.

Chien-Hsun Wang, et al, U.S. Appl. No. 12/953,148, "Device and Method for Forming Fins in Integrated Circuitry,", filed Nov. 23, 2010, 39 pages.

* cited by examiner

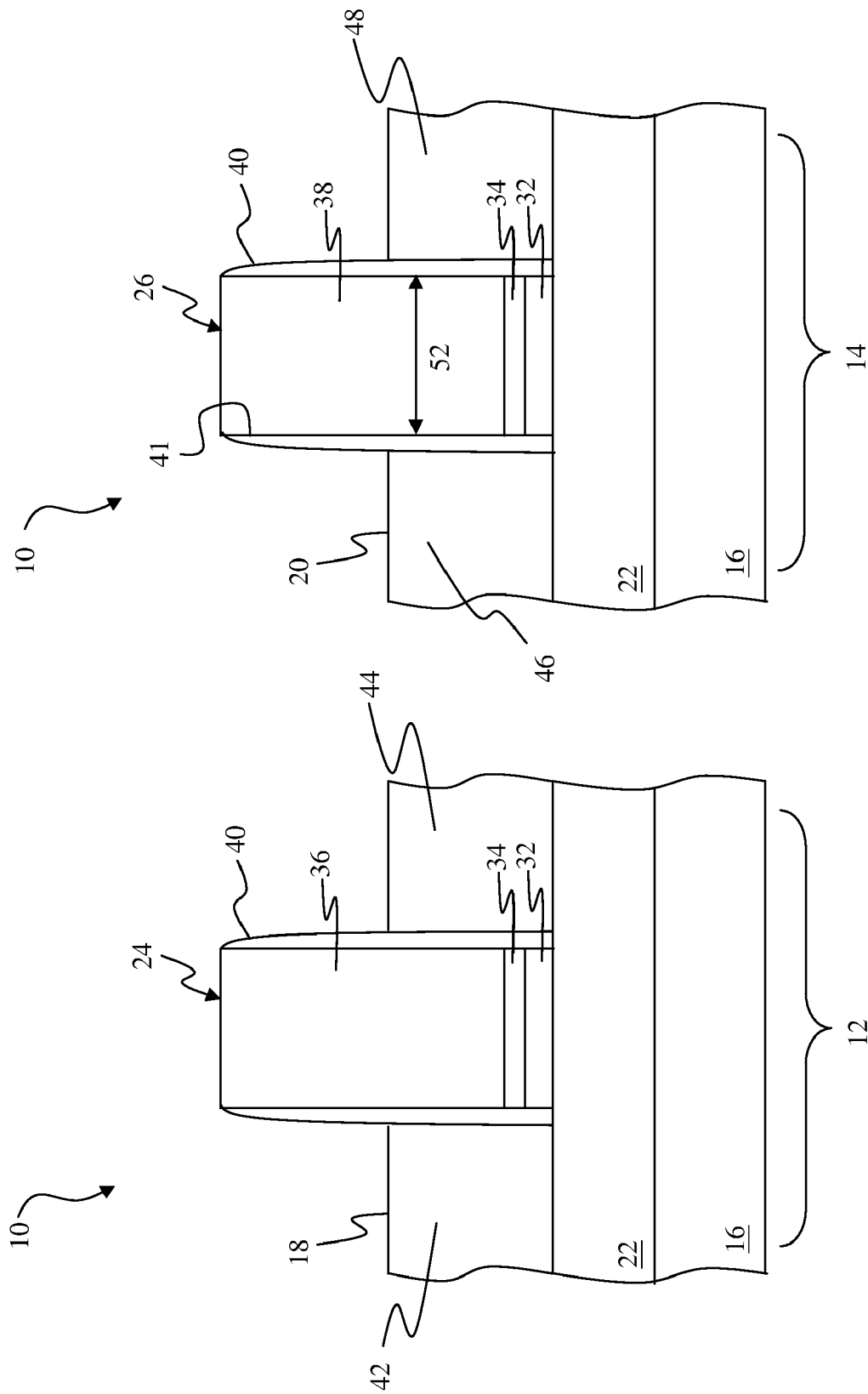

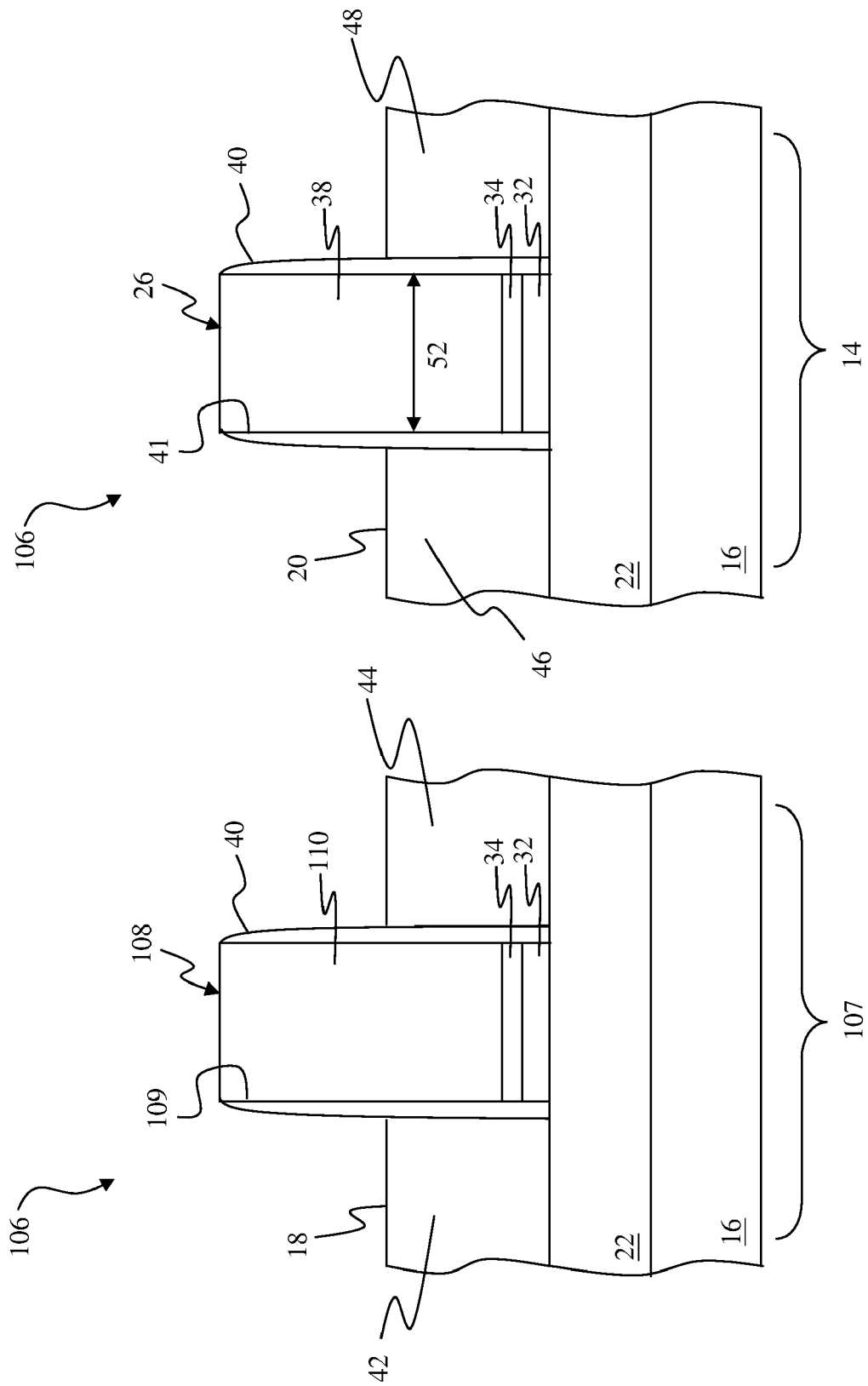

METHOD OF FABRICATING GATE STRUCTURES

BACKGROUND

As the semiconductor industry has strived for higher device density, higher performance, and lower costs, problems involving both fabrication and design have been encountered. One solution to these problems has been the development of a fin-like field effect transistor (FinFET). A typical FinFET includes a thin vertical 'fin' formed by etching spaced recesses into a substrate. The source, drain, and channel regions are defined within this fin. The transistor's gate is wrapped around the channel region of the fin, engaging it on both the top of the fin and the sides of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs. However, HKMG devices often require multiple layers in the gate structure. For example, a plurality of layers may be used to tune the work function values of the metal gates. Although these approaches have been adequate for their intended purpose, they have not been satisfactory in all respects. For example, materials currently used as work function layers very often impart high resistivity to the gate stack. In short-channel devices in particular, gate resistance may degrade performance because the work function layer may constitute the bulk of the metal gate electrode, or even the entire metal gate electrode.

SUMMARY

According to one of the broader forms of the invention, a method includes: providing a substrate; forming first and second projections extending upwardly from the substrate, the projections having respective first and second channel regions therein; forming a first structure engaging the first projection adjacent the first channel region, the first structure including: a first dielectric material over the first channel region, a non-metallic conductive layer over the first dielectric material, and a first opening over the conductive layer; forming a second structure engaging the second projection adjacent the second channel region, the second structure including: a second dielectric material over the second channel region, and a second opening larger than the first opening, the second opening being over the second dielectric material and the second channel region; and conformally depositing a pure metal with a low resistivity in the first and second openings.

According to another of the broader forms of the invention, a method includes: providing a substrate; forming first and second projections extending upwardly from the substrate, the projections having respective first and second channel regions therein; forming a first structure engaging the first projection adjacent the first channel region, the first structure including: a first dielectric material over the first channel region, and a first opening over the first dielectric material and the first channel region; forming a second structure engaging the second projection adjacent the second channel region, the second gate structure including: a second dielectric material over the second channel region, and a second opening over the second dielectric material and the second channel region; conformally depositing a pure first metal with an n-type work function value and a low resistivity in the first opening; and conformally depositing a pure second metal with a p-type work function value and a low resistivity in the second opening.

According to yet another of the broader forms of the invention, an apparatus includes: a substrate; a first device that includes a first projection and a first gate structure, the first projection extending upwardly from the substrate and having a first channel region therein, and the first gate structure engaging the first projection adjacent the first channel region, the first structure including: a high-k first dielectric material over the first channel region, an opening over the first dielectric layer and the first channel region, and a conformal, pure metal with a low resistivity disposed in the opening; and a second device that includes a second projection and a second gate structure, the second projection extending upwardly from the substrate and having a second channel region therein, and the second gate structure engaging the second projection adjacent the second channel region, the second structure including: a second dielectric material over the second channel region, and a silicide disposed over the second dielectric material and second channel region, wherein the silicide includes a metal that is the same metal disposed in the opening.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3-4 are diagrammatic fragmentary sectional views of the semiconductor device taken along lines 3-3 and 4-4 in FIG. 1, respectively.

FIGS. 18 and 19 are diagrammatic fragmentary sectional views similar to FIGS. 3 and 4 but showing a semiconductor device that is an alternative embodiment of the semiconductor device shown FIGS. 1-4.

DETAILED DESCRIPTION

The present disclosure relates generally to semiconductor devices, and more particularly, to a FinFET device and method of fabricating a FinFET device or portion of a device. It is understood, however, that specific embodiments are provided as examples to teach the broader inventive concept, and one of ordinary skill in the art can easily apply the teaching of the present disclosure to other methods or apparatus. In addition, it is understood that the methods and apparatuses discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed between the first and second features, such that the first and second features may not be in direct contact.

Figure 1:
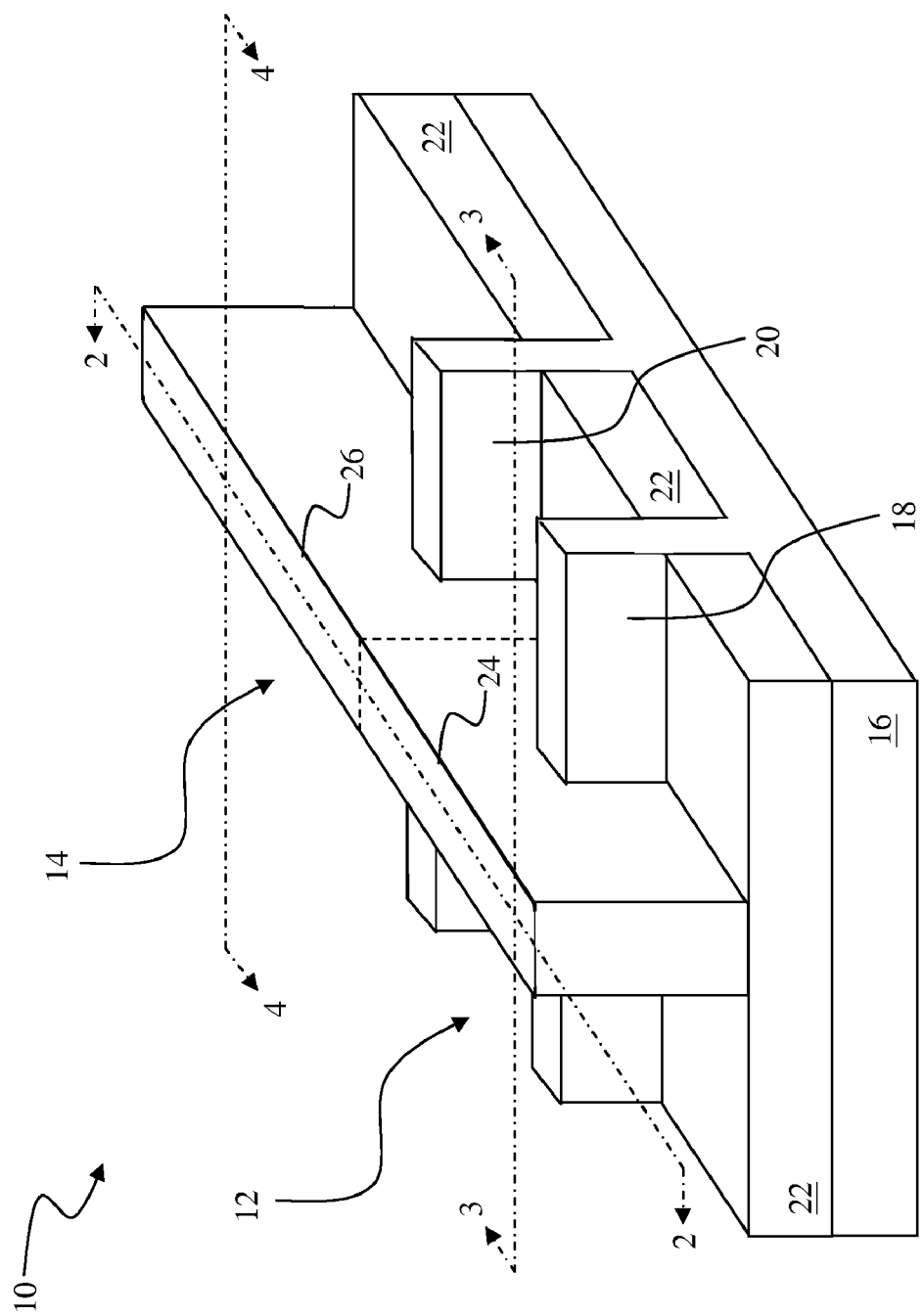
FIG. 1 is a diagrammatic fragmentary perspective view of a CMOS semiconductor device.

FIG. 1 is a diagrammatic fragmentary perspective view of a CMOS semiconductor device 10. The semiconductor device 10 is an integrated circuit that includes a fin-like n-channel metal-oxide-semiconductor field effect transistor (NMOS FinFET) 12 and a fin-like p-channel metal-oxide-semiconductor field effect transistor (PMOS FinFET) 14. NMOS FinFET 12 and PMOS FinFET 14 may alternatively be any type of fin-based transistor. The FinFETs 12 and 14 may be part of a microprocessor, memory cell (e.g., SRAM), and/or other integrated circuits.

The NMOS FinFET 12 and PMOS FinFET 14 are formed on a silicon semiconductor substrate 16. The substrate 16 may alternatively include other elementary semiconductors such as germanium, or include a compound semiconductor such as silicon carbide, gallium arsenide, indium arsenide, and indium phosphide. Alternatively, the substrate 16 may be a silicon-on-insulator (SOI) substrate. In such a case, the SOI substrate may be fabricated using separation by implantation of oxygen (SIMOX), wafer bonding, and/or other suitable methods.

The semiconductor device 10 includes fin structures (or projections) 18 and 20 that extend upwardly from the substrate 16 and form portions of the NMOS FinFET 12 and PMOS FinFET 14, respectively. Shallow trench isolation (STI) regions 22 surround the bottom portions of the fin structures 18 and 20 and prevent electrical interference or crosstalk. The STI regions 22 are composed of silicon oxide. Alternatively, they could be silicon nitride, silicon oxynitride, other suitable materials, and/or combinations thereof. It is understood that although two fin structures are illustrated, additional parallel fins may be formed from substrate 16 in a similar manner.

The semiconductor device 10 also includes gate structures 24 and 26 that overlay central portions of the fin structures 18 and 20, respectively. Gate structure 24 is a part of NMOS FinFET 12 and gate structure 26 is a part of PMOS FinFET 14. Further, gate structures 24 and 26 each include a plurality of layers which will be explained in more detail later. The gate structures 24 and 26 each engage three surfaces of respective fin structures 18 and 20—the top surface and two adjacent side surfaces.

The fin structures 18 and 20 and gate structures 24 and 26 of semiconductor device 10 are surrounded by an inter-level dielectric layer (ILD). But for the sake of clarity, semiconductor device 10 is depicted in FIG. 1 without this ILD.

Figure 2:
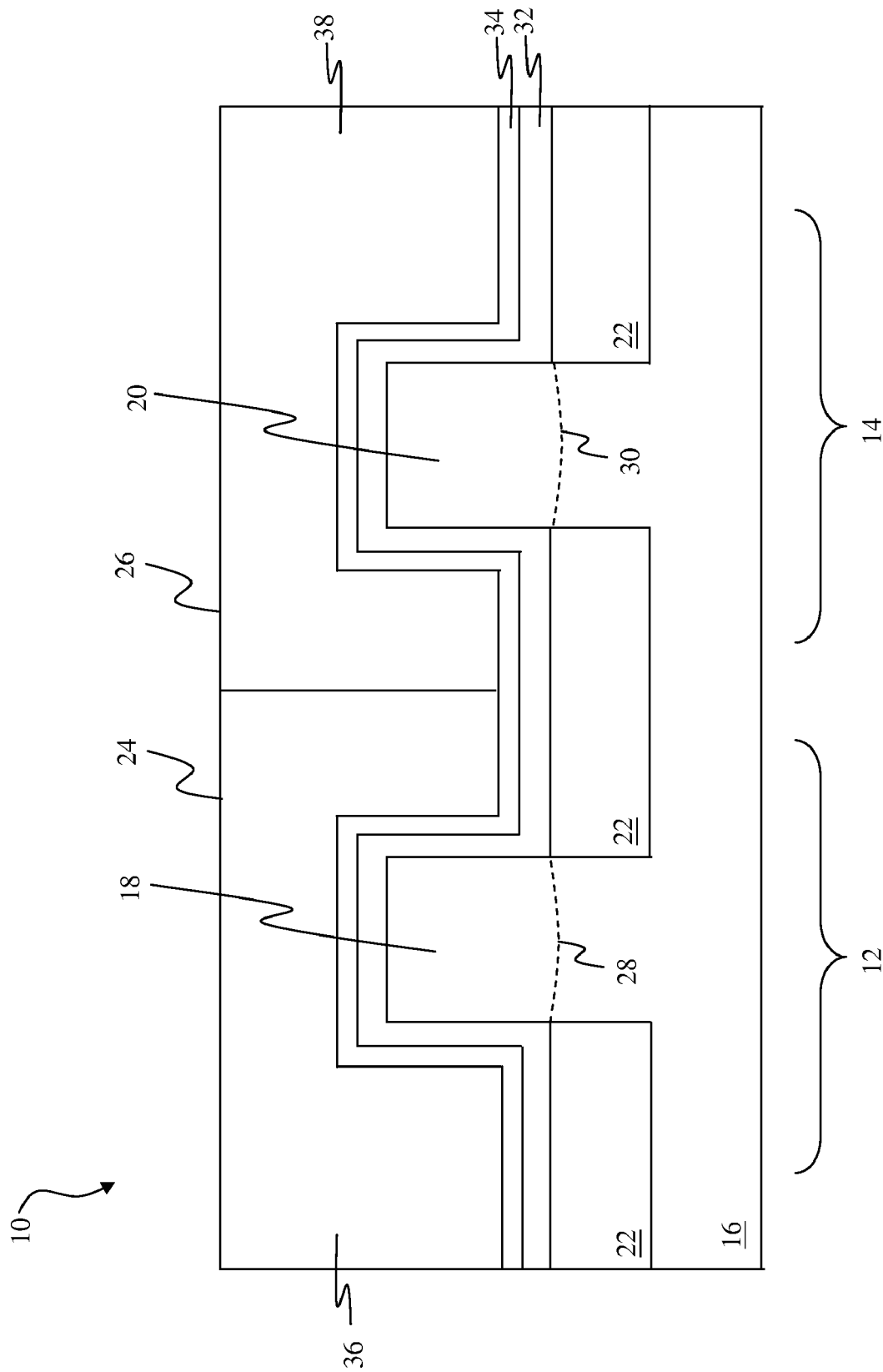
FIG. 2 is a diagrammatic fragmentary sectional view of the semiconductor device taken along line 2-2 in FIG. 1.

FIG. 2 is a diagrammatic fragmentary sectional view of the semiconductor device 10 taken along line 2-2 in FIG. 1. FIG. 2 depicts cross sections of the NMOS FinFET 12 and PMOS FinFet 14. The fin structure 18 includes a channel region 28 in the portion of the fin extending vertically higher than the STI regions 22. Optionally, the fin structure 18 may include not-illustrated epitaxial silicon (Si) growths on each side of the channel region 28. If the fin structure 18 includes the optional not-illustrated epitaxial Si growths, the channel region 28 will be tensile-strained. The fin structure 20 includes a channel region 30 in the portion of the fin extending vertically higher than the STI regions 22. Further, fin structure 20 may optionally include not-illustrated epitaxial silicon germanium (SiGe) growths on each side of the channel region 30. If the fin structure 20 includes the optional not-illustrated epitaxial SiGe growths, the channel region 30 will be compressive-strained.

As noted above, the gate structures 24 and 26 include a plurality of layers that form the gate portions of the FinFETs 12 and 14. In the lower-most portion of gate structures 24 and 26, a dielectric layer 32 overlays the STI regions 22 and the fin structures 18 and 20. The dielectric layer 32 engages the channel region 28 in the fin structure 18 on three sides and also engages the channel region 30 in the fin structure 20 on three sides. Here, the dielectric layer 32 is composed of a high-k dielectric material, such as hafnium oxide (HfOx). Alternatively, the dielectric layer 32 may include one or more other high-k dielectrics such as hafnium silicon oxide (HfSiO) or hafnium silicon oxynitride (HfSiON), or may be composed of a material with a standard dielectric constant, such as silicon oxide. Further, the dielectric layer 32 may be doped with elements such as Al, Ti, Ta, and/or La to adjust its dielectric constant. The dielectric layer 32 has a thickness in a range from about 1 to about 100 angstroms (Å). Although the dielectric layer 32 is illustrated as a single layer in FIG. 2, it may optionally include additional layers such as an interfacial layer of silicon oxide between the silicon of fin structures 18 and 20 and the remainder of the dielectric layer 32. A barrier layer 34 (also sometimes referred to as a capping layer, a diffusion layer, or an etch stop layer) is disposed above the dielectric layer 32. The barrier layer 34 is composed of titanium nitride (TiN) having a thickness in a range from about 5 to about 60 Å. Alternatively, the barrier layer 34 may include a metal carbide, TaN, or other material suitable to reduce or eliminate the risk of Fermi level pinning between the high-k material in dielectric layer 32 and nearby polysilicon layers.

The gate structure 24 includes a silicide 36 disposed above the barrier layer 34. The silicide 36 forms the electrode portion of the gate structure 24 and is composed of a silicide material with a low resistivity. In the present embodiment, the silicide material is a cobalt silicide, but alternatively it may be a nickel silicide or a platinum silicide, or other metal silicide with a low resistivity. Alternatively, the gate structure 24 may include a doped polysilicon layer disposed between the barrier layer 34 and the silicide 36.

The gate structure 26 includes a pure metal 38 disposed above the barrier layer 34. The pure metal forms the electrode portion of the gate structure 26 and is a low resistance metal with a p-type band edge effective work function value (p-metal). In the present embodiment the p-metal 38 is cobalt, but alternatively it may be nickel or platinum or some other low resistance pure metal with a p-type band edge effective work function value. Further, the p-metal 38 is a conformal metal such that the metal contains minimal voids or other defects that may increase gate resistance.

FIGS. 3-4 are diagrammatic fragmentary sectional views of the semiconductor device 10 taken along lines 3-3 and 4-4 in FIG. 1, respectively. FIG. 3 depicts a cross-section of the gate structure 24 that is a portion of NMOS FinFET 12. And FIG. 4 depicts a cross-section of the gate structure 26 that is a portion of PMOS FinFET 14. The gate structure 24 includes two gate spacers 40 that abut each side of the dielectric layer 32, barrier layer 34, and silicide 36 and extend the full length of each. Similarly, the gate structure 26 includes two gate spacers 40 that abut each side of the dielectric layer 32, barrier layer 34, and p-metal 38 and extend the full length of each. The gate spacers 40 are composed of a dielectric material. Here, they are silicon nitride. Alternatively, the gate spacers may be silicon carbide, silicon oxynitride, other suitable materials, and/or combinations thereof.

The gate structure 26 includes an opening 41 with side surfaces defined by the gate spacers 40 and a bottom surface defined by the barrier layer 34. Portions of the opening 41 over the STI region 22 (as opposed to over the fin structure 20) have a high aspect ratio of approximately 3 or more. The opening 41 is completely filled with the p-metal 38.

A source region 42 and a drain region 44 are disposed in the fin structure 18 on opposite sides of the gate structure 24. The channel region 28 (FIG. 2) is interposed between the source and drain regions 42 and 44 in the fin structure 18. These source and drain regions are doped regions having a dopant incorporated therein that is appropriate for the design requirements of the FinFET 12. Here, because fin structure 18 is part of an NMOS device, source and drain regions 42 and 44 are doped with an n-type dopant such as phosphorus or arsenic, or combinations thereof. Similarly, a drain region 46 and a source region 48 are disposed in the fin structure 20 on opposite sides of the gate structure 26. The channel region 30 (FIG. 2) is interposed between the drain and source regions 46 and 48 in the fin structure 20. Because fin structure 20 is part of a PMOS device, source and drain regions 46 and 48 are doped with a p-type dopant such as boron.

In FIG. 4, the PMOS FinFET 14 is a short-channel device with a physical gate length 52. Short-channel devices such as PMOS FinFET 14 typically have a gate length of 60 nm or below. Because the gate length 52 is small and the vertical dimension of the gate structure 26 is large, the opening 41 formed during a gate replacement process has a high aspect ratio. Such openings in FinFET gate structures typically have an aspect ratio of approximately 3 or more. The formation of a metal gate electrode in a high aspect ratio opening presents challenges. For example, in short-channel devices, depositing a work function metal in a high aspect ratio opening may completely fill the opening even if that is not intended. Typical work function metals contain highly resistive nitrides that cause the overall FinFET gate resistance to be high, resulting in poor device performance. By conformally depositing a pure metal with low resistivity, such as the p-metal 38, during the FinFET gate replacement process, gate resistance may be reduced. Further, a conformal deposition process ensures the metal gate electrode will have minimal voids and other defects that may increase gate resistance. Conformal deposition processes typically fill high-aspect ratio openings in short-channel devices. However, even in short-channel devices, seams may sometimes result from a conformal metal fill.

FIGS. 5-6, 7-8, 9-10, 11-12, 13-14, and 15-16 are pairs of diagrammatic fragmentary sectional views similar to FIGS. 3 and 4 but showing the semiconductor device 10 during various successive stages of manufacture. The stages of manufacture depicted in FIGS. 5-16 correspond with fabrication of the semiconductor device 10 during a hybrid gate replacement process flow. In a hybrid process, the gate portion of the NMOS FinFET 12 is partially formed with a gate first process and the gate portion of the PMOS FinFET 14 is formed with a gate last process. It should be understood that additional processes may be provided before, during, and/or after the stages illustrated in FIGS. 5-16, and that some selected processes may only be briefly described if they are well known in the art.

Figure 6:
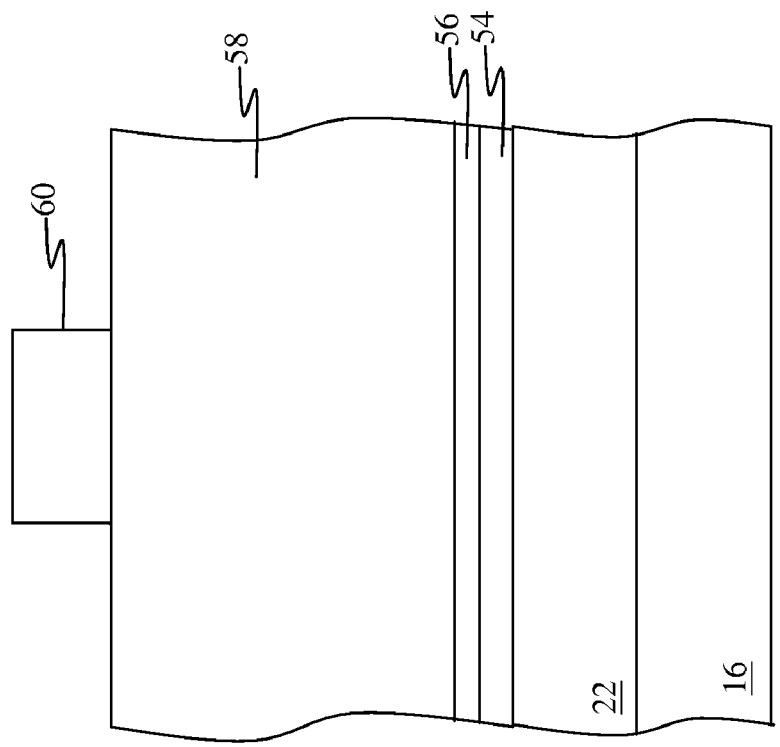
FIGS. 5-6, 7-8, 9-10, 11-12, 13-14, and 15-16 are pairs of diagrammatic fragmentary sectional views similar to FIGS. 3 and 4 but showing the semiconductor device of FIG. 1 during various successive stages of manufacture.
Figure 5:
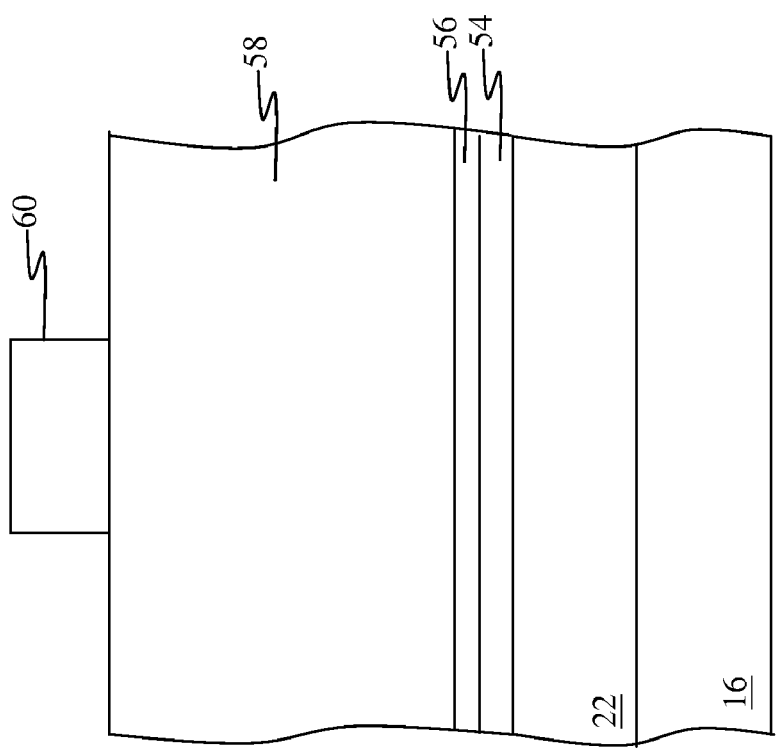

Referring to FIGS. 5 and 6, the silicon semiconductor substrate 16 is provided. The fin structures 18 and 20 (FIGS. 1-4) are formed from the substrate 16 using suitable processes including photolithography and etch processes. The photolithography processes include forming a photoresist layer (resist) overlying the substrate 16, exposing the resist to a pattern, performing post-exposure bake processes, and developing the resist to form a masking element. The masking element is then used to etch recesses into the substrate 16, leaving the fin structures 18 and 20. The recesses forming fin structures 18 and 20 may be etched using reactive ion etch (RIE) and/or other suitable processes. Alternatively, the fin structures may be formed by double-patterning lithography (DPL) process. DPL allows for enhanced feature (e.g., fin) density. Various DPL methodologies may be used, including double exposure (e.g., using two mask sets), forming spacers adjacent features and removing the features to provide a pattern of spacers, resist freezing, and/or other suitable processes. After the fin structures 18 and 20 are formed, silicon dioxide or other suitable dielectric is deposited and etched to form the shallow trench isolation (STI) regions 22 that surround and isolate the fin structures. This may be accomplished by any suitable process, which may include dry etching, wet etching, and a chemical vapor deposition process.

Next, a dielectric layer 54 with a thickness in the range of about 1 to 100 Å is formed over the fin structures 18 and 20 (FIGS. 1-4) and the STI regions 22. The dielectric layer 54 is composed of a high-k dielectric material, HfOx, and is deposited using chemical vapor deposition (CVD). The high-k material of dielectric layer 54 is deposited on all portions of the fin structures 18 and 20 above the STI regions 22, including the top and side portions. Next, a barrier layer 56 of TiN is deposited by CVD over the dielectric layer 54 to a thickness in a range of about 5 to 60 Å. A polysilicon layer 58 is then formed by CVD over the barrier layer 56. The polysilicon is deposited to a thickness in a range of about 50 to 1600 Å. After the polysilicon is deposited, it is doped to adjust the work function value of the associated NMOS FinFET 12. The layers 54, 56, and 58 may each alternatively be formed using any other suitable process, such as physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. Also, a photoresist layer is deposited over the layer 58 and patterned in a known manner to leave portions 60 that facilitate removal of portions of the layer stack in subsequent steps.

Figure 8:
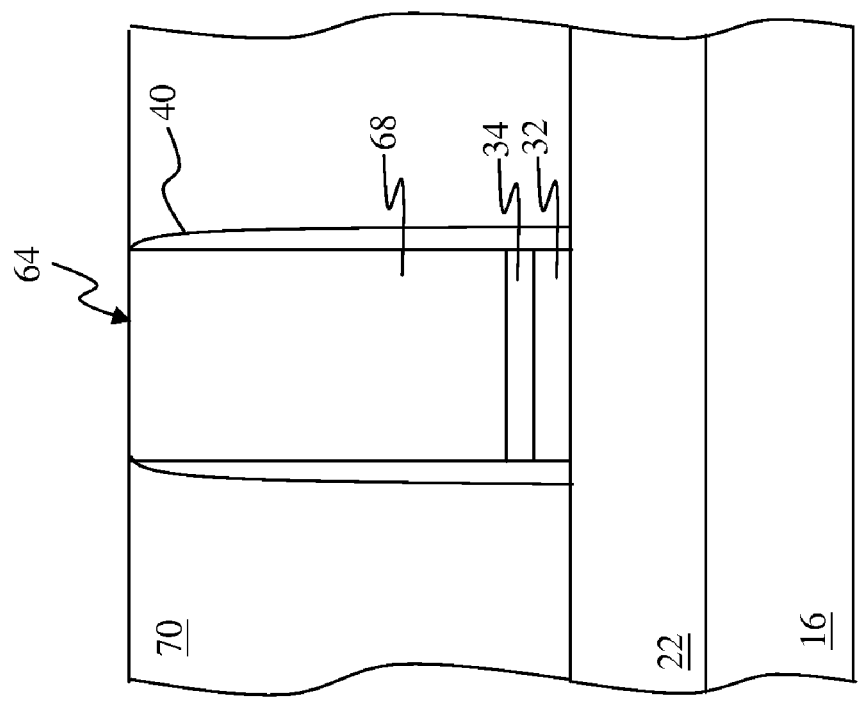
Figure 7:
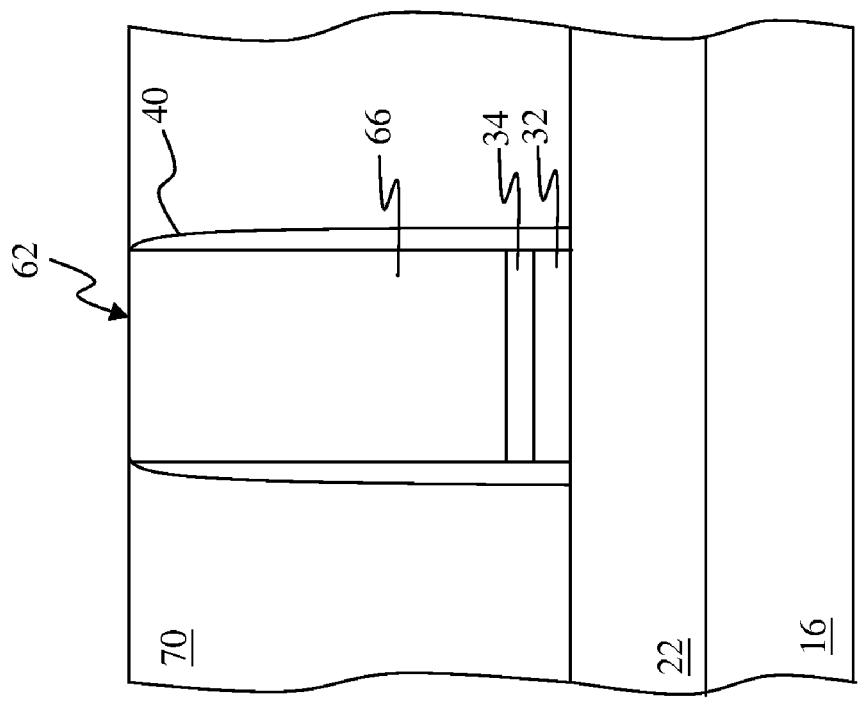

Referring now to FIGS. 7 and 8, photolithography patterning processes are employed to form an interim gate structure 62 and an interim gate structure 64, by removing the portions of the layers 54, 56, and 58 that are not protected by the photoresist portions 60 (FIGS. 5-6). After patterning, the dielectric layer 32 (a portion of layer 54), the barrier layer 34 (a portion of layer 56), and a polysilicon layer 66 (a portion of layer 58) remain over fin structure 18 (FIGS. 1-4), and form the interim gate structure 62. And the dielectric layer 32 (a portion of layer 54), the barrier layer 34 (a portion of layer 56), and a dummy polysilicon layer 68 (a portion of layer 58) remain over the fin structure 20 (FIGS. 1-4), and form the interim gate structure 64. The photolithography patterning process used to form the gate structures may include any number of suitable steps, such as photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing. The etching processes include dry etching, wet etching, and/or other etching methods. It is understood that the above example does not limit the processing techniques that may be utilized to form the layers discussed above. After patterning the layers over the fin structures 18 and 20, known processes are employed to form the spacers 40 along the sides of the interim gate structures 62 and 64. After deposition and etching, the spacers 40 protect two approximately vertical sides of each interim gate structure 62 and 64, the vertical sides being approximately perpendicular to the fin structures 18 and 20.

Next, an interlayer (or inter-level) dielectric (ILD) layer 70 is next formed over the semiconductor device 10, including interim gate structures 62 and 64. The ILD layer 70 is composed of a dielectric such as silicon oxide. The ILD layer 70 initially has a greater thickness than that shown in FIGS. 7 and 8. Subsequent to the deposition of the ILD layer 70, a chemical mechanical polishing (CMP) process is performed, until a top portion of each interim gate structure 62 and 64 is exposed, as shown in FIGS. 7 and 8.

Figure 10:
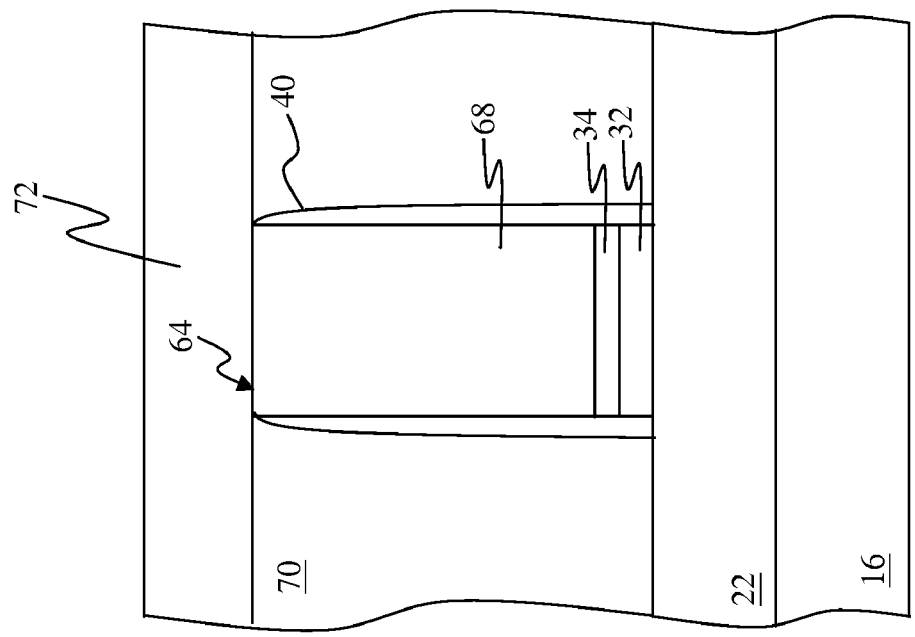
Figure 9:
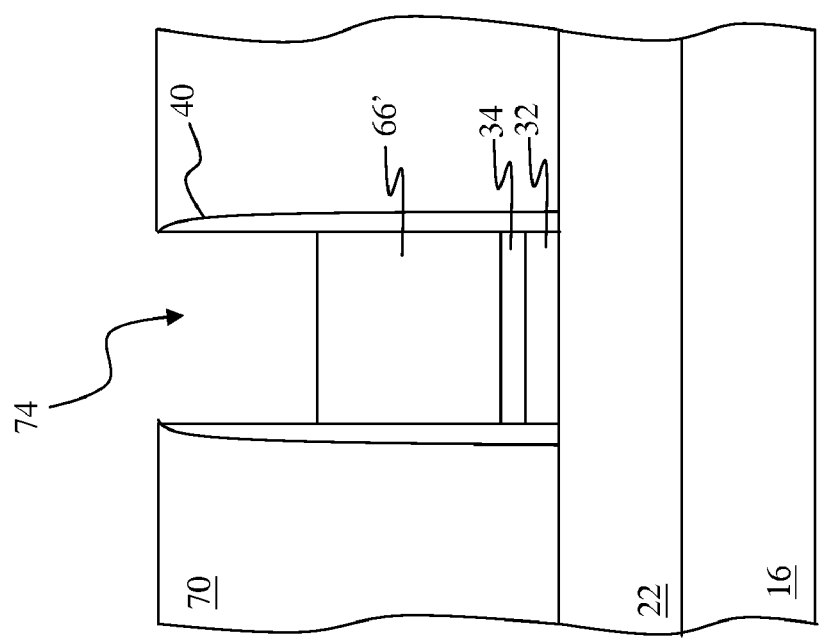

Referring now to FIGS. 9 and 10, a patterned photoresist layer 72 is formed over a portion of the semiconductor device 10 to protect the interim gate structure 64. Subsequently, a portion of the polysilicon layer 66 is removed to form an opening 74, leaving a portion 66' of the original layer 66. The polysilicon is removed with a wet etch process that includes exposing the polysilicon to a hydroxide solution such as ammonim hydroxide. Alternatively, the polysilicon of layer 66 may be removed by a dry etching process or any other suitable removal process.

Figure 11:
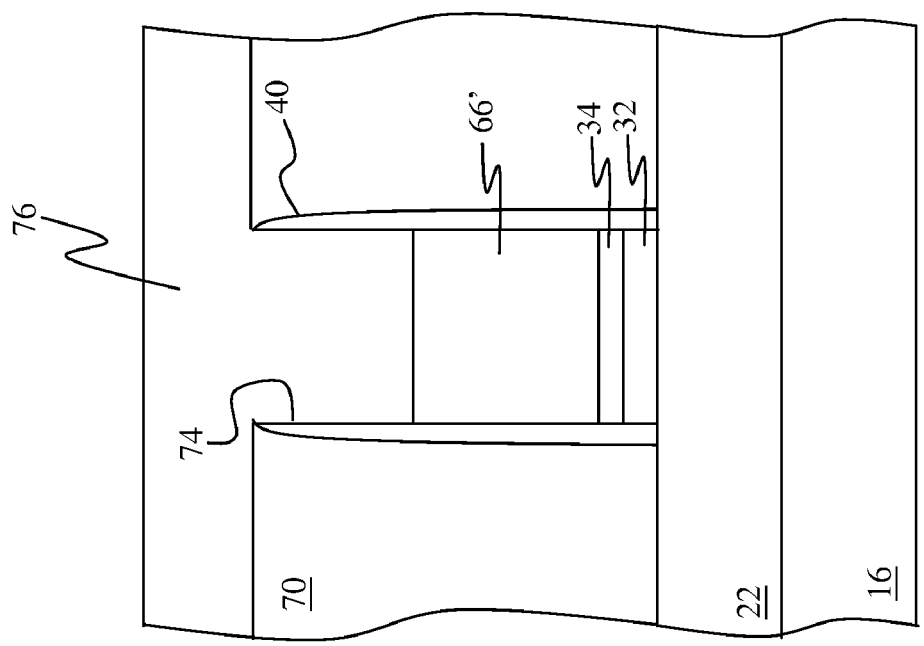
Figure 12:
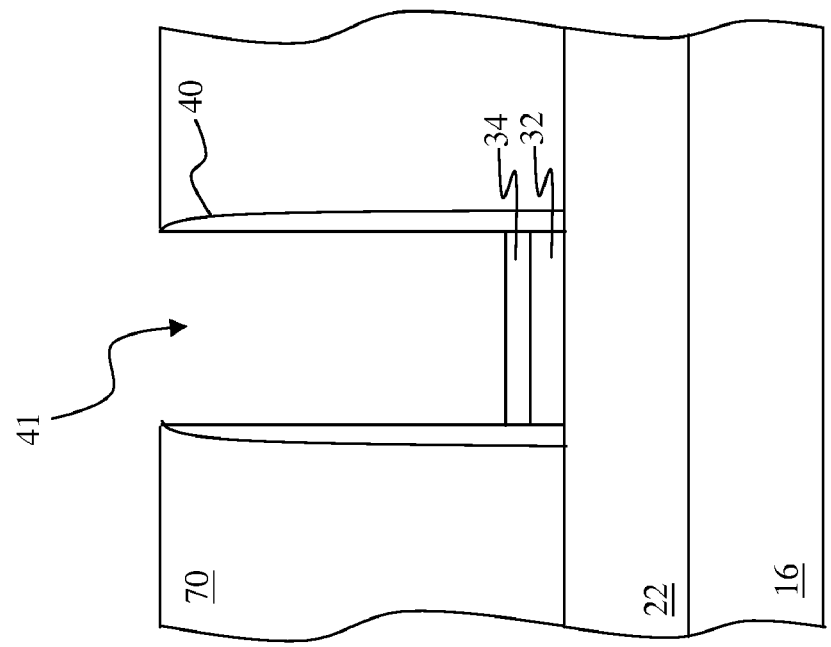

Referring now to FIGS. 11 and 12, the patterned photoresist layer 72 (FIG. 10) is removed and a second patterned photoresist layer 76 is formed over the semiconductor device 10 to protect the remaining portion 66' of the polysilicon layer. Subsequently, the dummy polysilicon layer 68 (FIG. 10) is etched away to form the opening 41. Portions of the opening 41 over the STI regions 22 have a high-aspect ratio of approximately 3 or above. The photoresist layer 76 is then removed. The photoresist layers 72 and 76 used in the patterning process described above may alternatively be replaced with other types of protective materials such as spin-on-glass (SOG).

Figure 14:
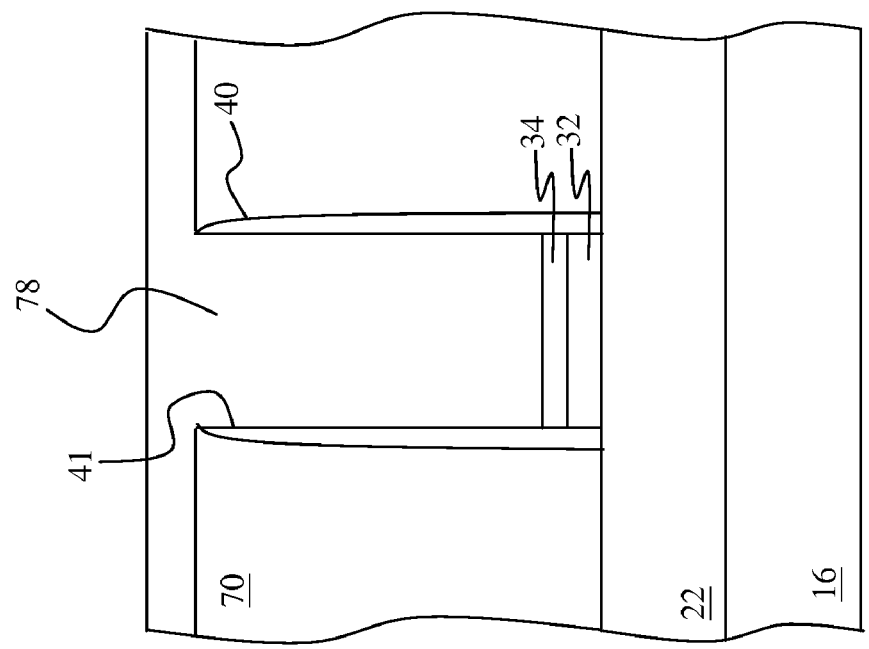
Figure 13:
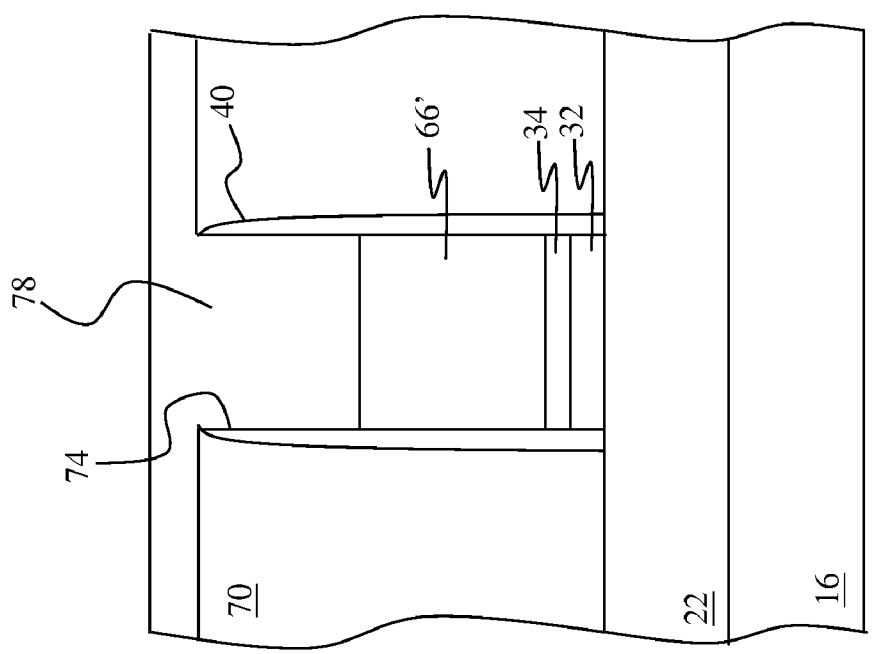

Referring now to FIGS. 13 and 14, a layer 78 of a pure p-metal is deposited in the openings 74 and 41 to simultaneously form the gate electrodes of the FinFETs 12 and 14. The pure p-metal of the layer 78 is identically the same p-metal shown at 38 in FIG. 4. The p-metal layer 78 is deposited by a conformal process such that minimal voids remain in the metal after deposition. Because the FinFET 14 is a short-channel device, the p-metal layer 78 should completely fill the opening 41. However, as mentioned above, it is possible a seam may be observed after the conformal metal fill. In the present embodiment, cobalt is conformally deposited with chemical vapor deposition (CVD) or one of its variants including: high density plasma CVD (HDPCVD), metal organic CVD (MOCVD), remote plasma CVD (RPCVD), and plasma enhanced CVD (PECVD). Alternatively, the p-metal may be nickel or platinum or any other pure p-metal with low resistivity and a band edge p-type work function. And the conformal process may be atomic layer deposition (ALD) or any other process suitable to fill the openings with minimal voids.

Figure 16:
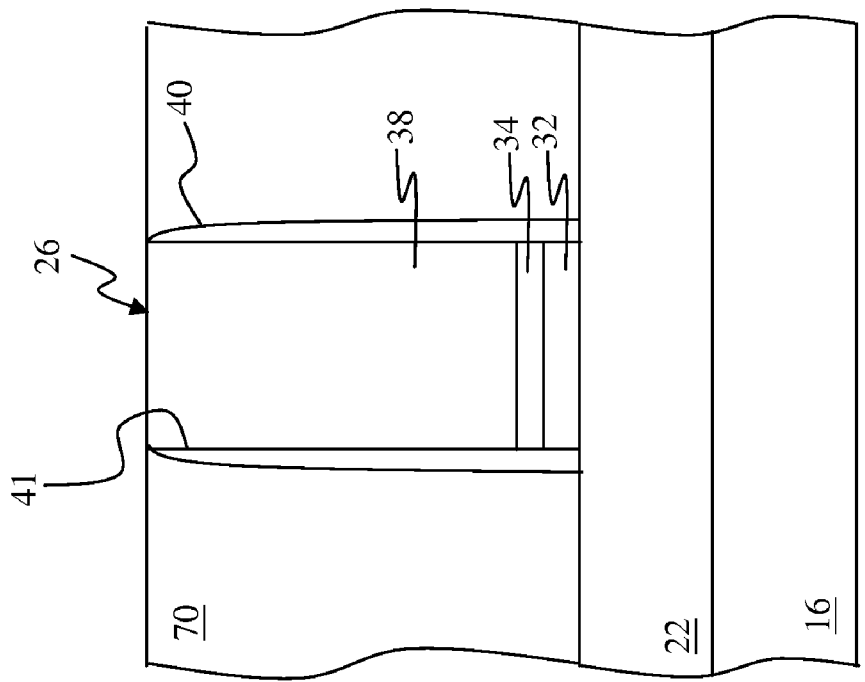
Figure 15:
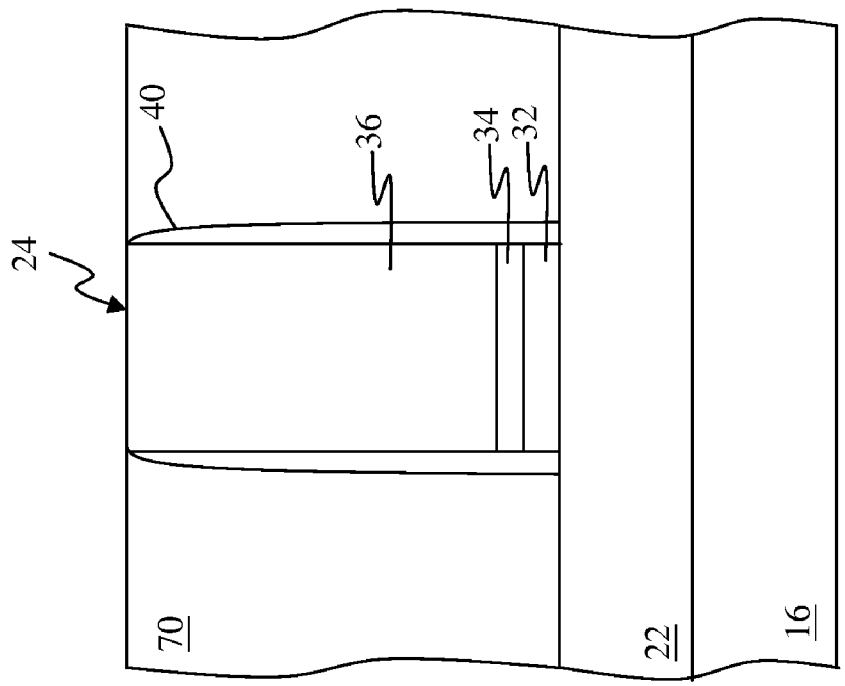

Referring now to FIGS. 15 and 16, a CMP is performed to remove portions of the p-metal layer 78 outside of the openings 74 and 41. During subsequent processing, the semiconductor device 10 may undergo heat treatments, and as a result the remaining portion 66' of the polysilicon layer and the p-metal of layer 78 disposed in the opening 74 will undergo a silicidation process to create the silicide 36. In the current embodiment, the entirety of the polysilicon portion 66' has reacted with the p-metal of layer 78 and thus gate structure 24 contains a fully silicided electrode 36. However, depending on the time and temperature of the heat treatments in the subsequent processing, some portion of the polysilicon layer 66' may not react with the p-metal of layer 78 and may remain in the final gate structure 24 between the barrier layer 34 and the silicide layer 36.

It is understood that the semiconductor device 10 will undergo further processing to complete fabrication. For example, a not-illustrated multilayer interconnection (MLI) including metal layers (e.g., M1, M2, etc.) and inter-metal dielectric (IMD) will be formed above fin and gate structures 18, 20, 24, and 26 in order to electrically couple various device parts to form an integrated circuit. The multilayer interconnection includes vertical interconnects, such as conventional vias or contacts, and horizontal interconnects, such as metal lines. The various interconnection features may utilize various conductive materials including copper, tungsten and silicide. In one example, a damascene process is used to form copper multilayer interconnection structure.

Figure 17:
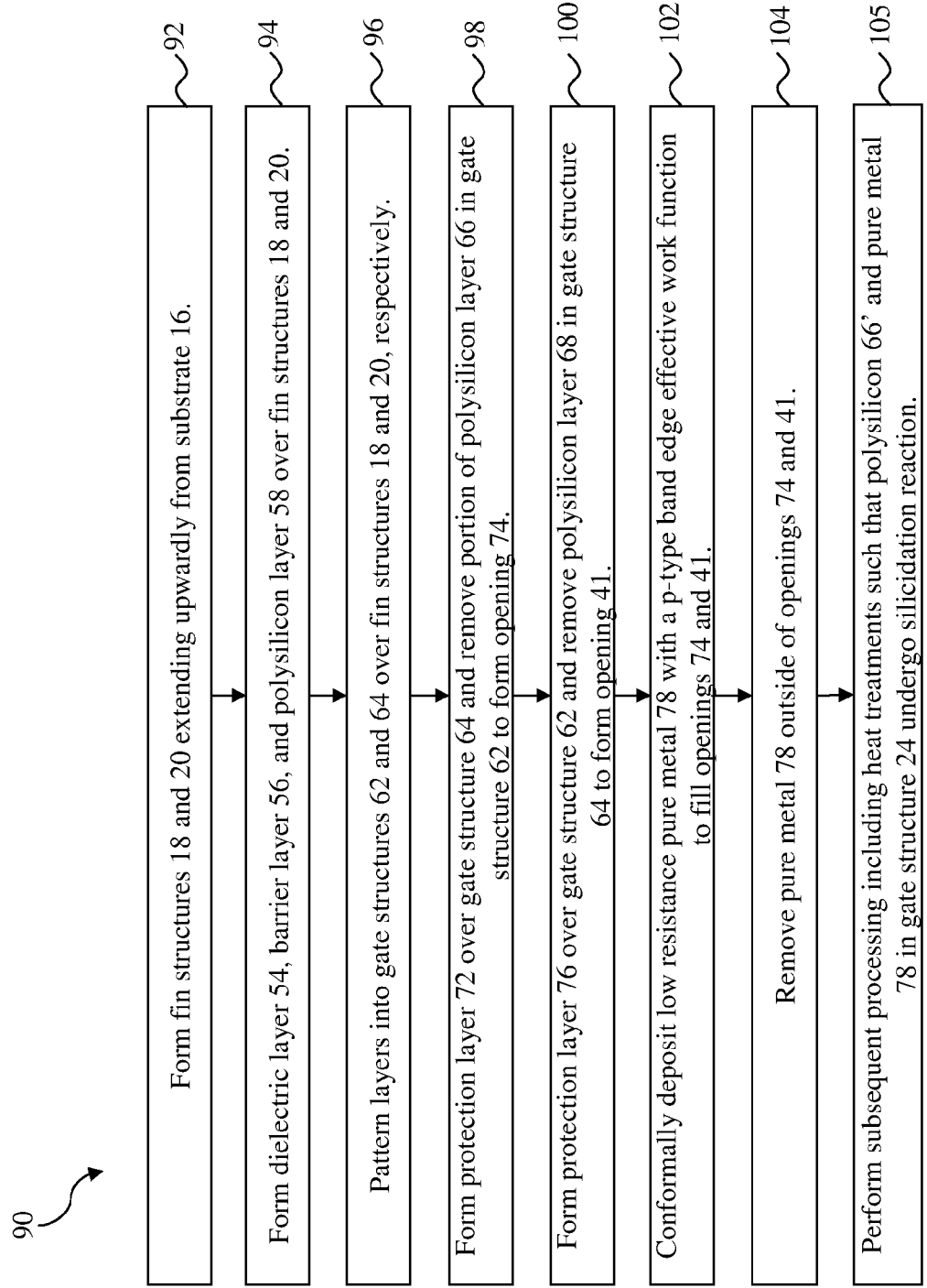
FIG. 17 is a high-level flowchart showing a process that is described in association with FIGS. 5-16.

FIG. 17 is a high-level flowchart showing the hybrid gate replacement process 90 that was described above in association with FIGS. 5-16. Process 90 begins at block 92 where the fin structures 18 and 20 are formed from the substrate 16. The STI regions 22 are formed after the fin structures are formed. The process 90 proceeds to block 94 where the dielectric layer 54, the barrier layer 56, and the polysilicon layer 58 are formed over the fin structures 18 and 20. Then, in block 96, the layers formed in block 94 are patterned into the interim gate structures 62 and 64. The interim gate structure 62 overlays the channel region 28 of the fin structure 18 and the interim gate structure 64 overlays the channel region 30 of the fin structure 20. Also, the ILD layer 70 is deposited over the semiconductor device 10 and a CMP is performed to expose the top portions of the gate structures 62 and 64. Process 90 proceeds to block 98 where the patterned photoresist layer 72 is formed over the interim gate structure 64, and a portion of the polysilicon layer 66 is removed to form the opening 74. The photoresist layer 72 is then removed. Then, in block 100 the patterned photoresist layer 76 is formed over the remaining polysilicon portion 66' and the dummy polysilicon layer 68 in the interim gate structure 64 is completely removed to form the opening 41. The photoresist layer 76 is then removed. Next, in block 102, the low resistance pure metal 38 with a p-type band edge effective work function is conformally deposited in the openings 74 and 41. Process 90 proceeds to block 104 where the p-metal 78 outside of the openings 74 and 41 is removed. Finally, in block 105, subsequent processing is performed which may include heat treatment steps. During such heat treatments, the remaining polysilicon material 66' and the pure p-metal of layer 78 in the opening 74 will react to form the silicide 36.

The hybrid gate replacement process depicted in FIGS. 5-16 is not limited to the aspects of the process described above. For example, the removal of the polysilicon material from the interim gate structures may occur in a different order. Further, the openings 74 and 41 may be formed sequentially and the sequence of PMOS and NMOS FinFET formation may be reversed. Also, if the PMOS FinFET 14 is a long-channel device, the opening 41 may be significantly larger and the time required to conformally fill the opening with the p-metal of layer 78 may be prohibitive. In such a case, the deposition of p-metal 78 may only partially fill opening 41

(creating a seam) and an additional deposition step may be used to fill the remainder of opening 41. Specifically, a conductive fill metal such as aluminum may be deposited over the p-metal 38 to fill the remainder of opening 41 and form the gate structure. This additional deposition may be carried out by physical vapor deposition (PVD) or other suitable deposition process.

FIGS. 18 and 19 are diagrammatic fragmentary sectional views similar to FIGS. 3 and 4 but showing a semiconductor device 106 that is an alternative embodiment of the semiconductor device 10 shown FIGS. 1-4. The semiconductor device 106 is similar to the semiconductor device 10 except for the differences described below. Similar aspects of the semiconductor devices in FIGS. 3 and 4 and FIGS. 18 and 19 are numbered the same for the sake of clarity.

The semiconductor device 106 is an integrated circuit that includes NMOS FinFET 107. The NMOS FinFET 107 may alternatively be any type of fin-based transistor. The semiconductor device 106 also includes a gate structure 108 that overlays a central portion of the fin structure 18. The gate structure 108 is part of the NMOS FinFET 107 and includes a plurality of layers that form the gate portion of the FinFET. The gate structure 108 includes an opening 109 with side surfaces defined by the gate spacers 40 and a bottom surface defined by the barrier layer 34. Portions of the opening 41 over the STI region 22 (as opposed to over the fin structure 18) have a high aspect ratio of approximately 3 or more. Disposed in the opening 109 is a low resistance pure metal 110 with an n-type band edge effective work function value (n-metal). In the present embodiment the pure n-metal 110 is aluminum, but alternatively it may be tantalum or some other low resistance pure metal with a n-type band edge effective work function value. Further, the n-metal 110 is a conformal metal such that the metal completely fills the opening 109, and thus contains minimal voids or other defects that may increase gate resistance.

Figure 21:
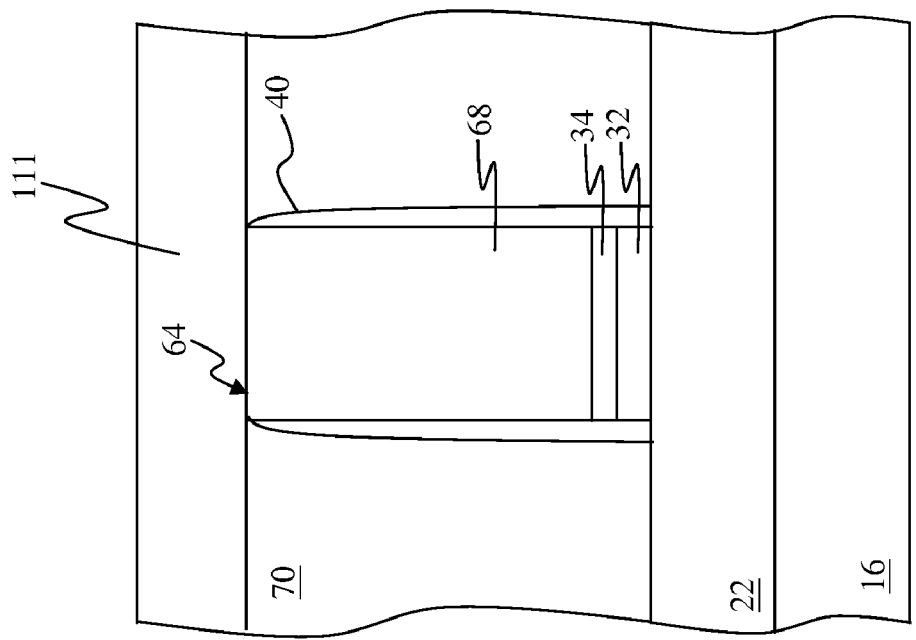
FIGS. 20-21, 22-23, 24-25, 26-27, and 28-29 are pairs of diagrammatic fragmentary sectional views similar to FIGS. 18 and 19 but showing the semiconductor device of FIGS. 18 and 19 during various successive stages of manufacture.
Figure 20:
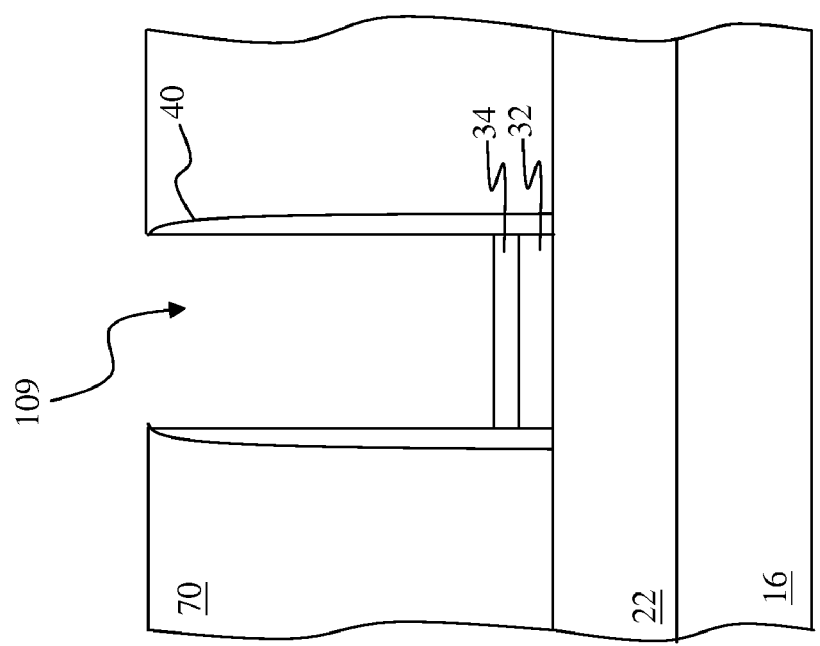

FIGS. 20-21, 22-23, 24-25, 26-27, and 28-29 are pairs of diagrammatic fragmentary sectional views similar to FIGS. 18 and 19 but showing the semiconductor device 106 during various successive stages of manufacture. The stages of manufacture depicted in FIGS. 20-29 are similar to the stages of manufacture depicted in FIGS. 5-16, except that in FIGS. 20-29 a fully gate last process flow is depicted. That is, the gate portions of both FinFETs 107 and 14 are formed using a gate last process. The stages of manufacture for both processes are similar up to the stage depicted by FIGS. 7 and 8. Thus, FIGS. 20 and 21 depict a stage of manufacture of the fully gate last process following the stage depicted in FIGS. 7 and 8. Similar aspects of FIGS. 5-16 and FIGS. 20-29 are numbered the same for the sake of clarity. It should be understood that additional processes may be provided before, during, and/or after the stages illustrated in FIGS. 20-29, and that some selected processes may only be briefly described if they are well known in the art.

Referring now to FIGS. 20 and 21, a patterned photoresist layer 111 is formed over a portion of the semiconductor device 14 to protect the interim gate structure 64. Subsequently, the polysilicon layer 66 (FIG. 7) is completely removed to form opening 109. Portions of the opening 109 over the STI regions 22 have a high-aspect ratio of approximately 5 or more. The polysilicon material is removed with a wet etch process that includes exposing the polysilicon to a hydroxide solution such as ammonium hydroxide. Alternatively, the polysilicon of layer 66 may be removed by a dry etching process or any other suitable removal process.

Figure 23:
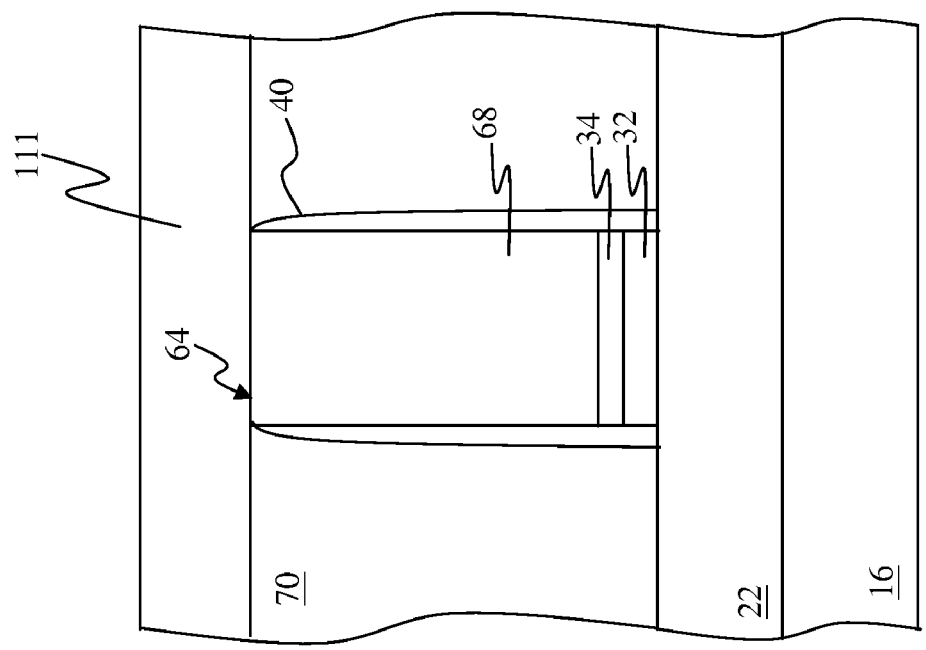
Figure 22:
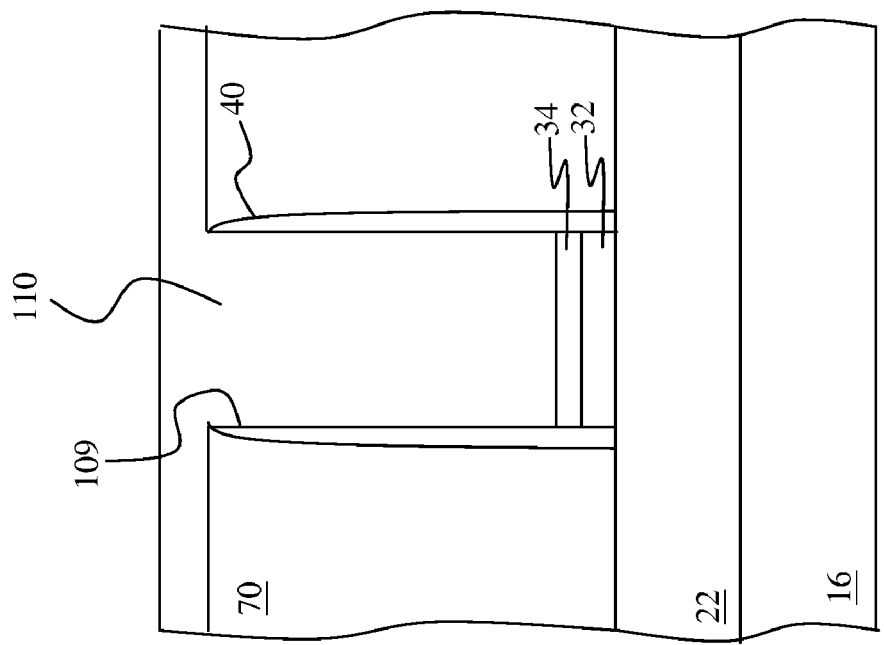

Referring now to FIGS. 22 and 23, a low resistance pure metal 110 with an n-type band edge effective work function value (n-metal) is deposited in the opening 109. Because the FinFET 107 is a short-channel device, the n-metal 110 should completely fill the opening 109. However, as mentioned above, it is possible a seam may be observed after the conformal metal fill. The n-metal 110 is conformally deposited such that it contains minimal voids or defects that may increase gate resistance. In the current embodiment, aluminum is deposited by CVD or one of its variants including HDPCVD, MOCVD, RPCVD, and PECVD. Alternatively, the n-metal may be tantalum or any other pure n-metal with low resistivity and a band edge work function. And the conformal process utilized may be ALD or any other process suitable to fill the openings without voids.

Figure 25:
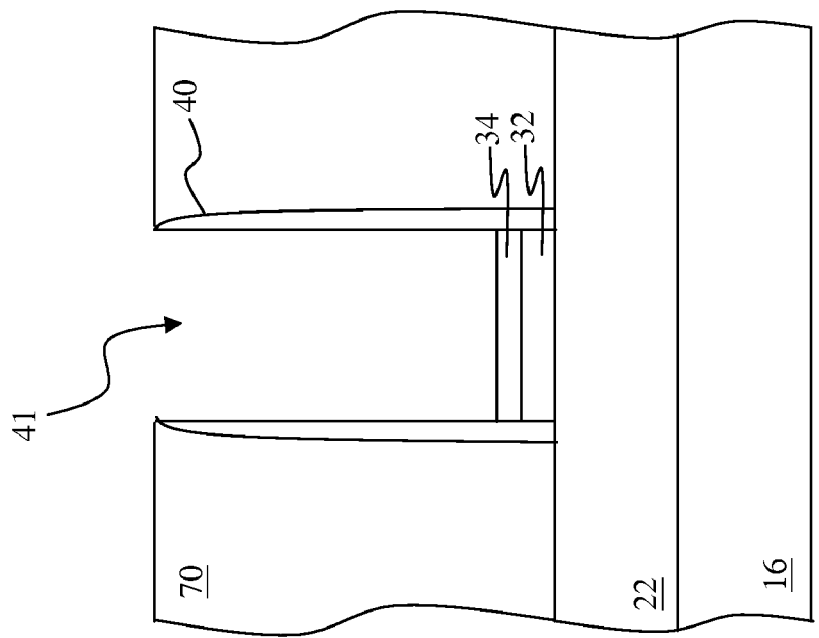
Figure 24:
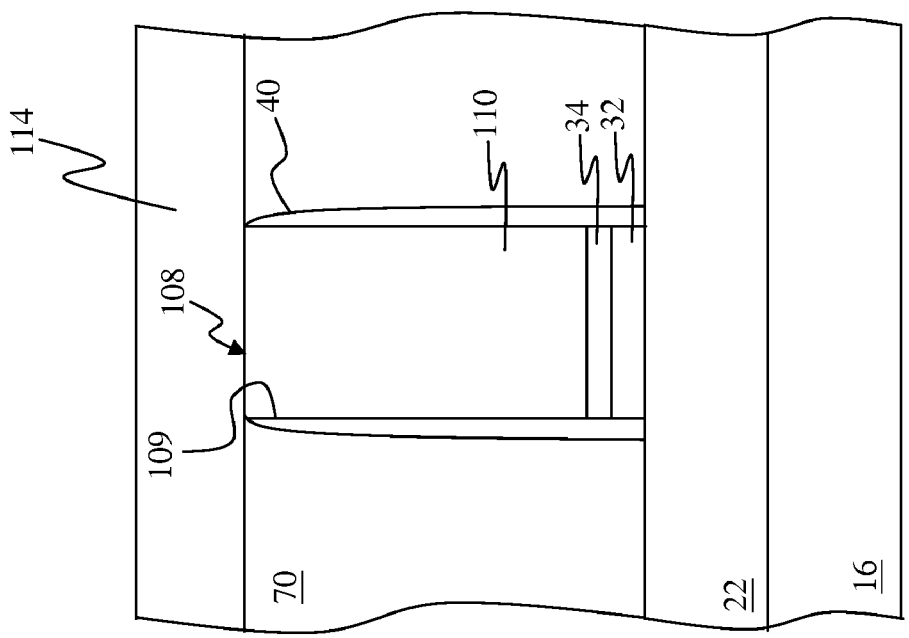

Referring now to FIGS. 24 and 25, a CMP is performed to remove portions of the n-metal 110 outside of the opening 109. A final n-type gate structure 108 is thus formed. The photoresist layer 111 is also removed. Next, a patterned photoresist layer 114 is formed over the gate structure 108. Subsequently, the polysilicon layer 68 is etched away to form the opening 41. Portions of the opening 41 over the STI regions 22 have a high-aspect ratio of approximately 5 or more.

Figure 27:
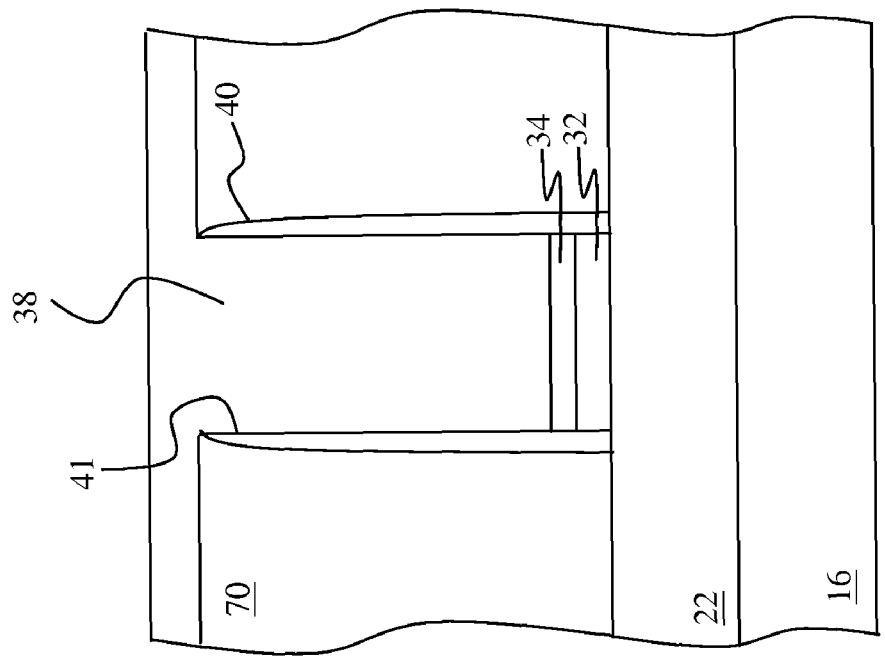
Figure 26:
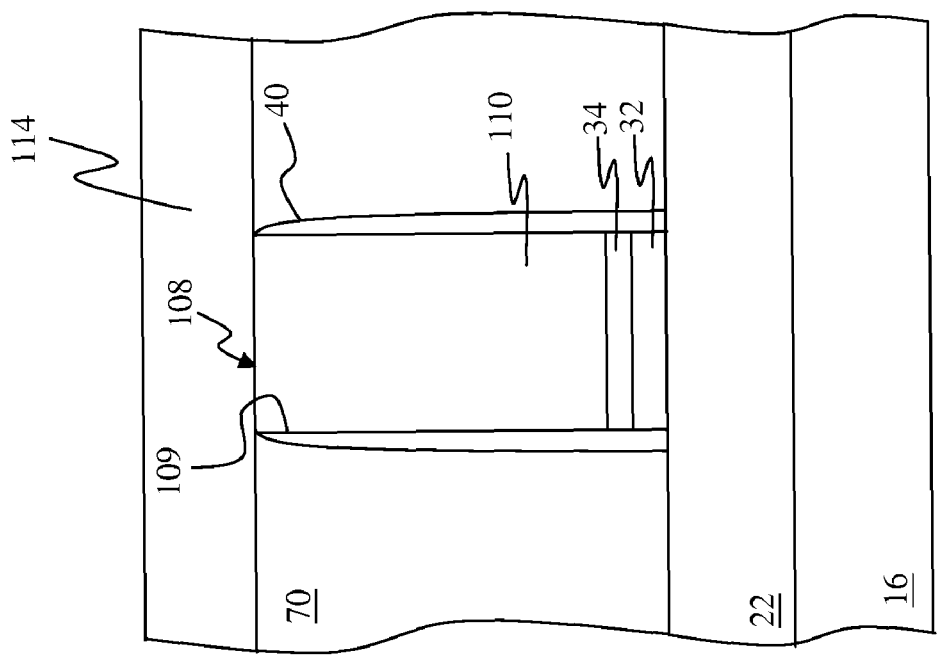

Referring now to FIGS. 26 and 27, the low resistance pure metal 38 with an p-type band edge effective work function value (p-metal) is deposited in the opening 41. Because the FinFET 14 is a short-channel device, the p-metal 38 completely fills the opening 41. The p-metal 38 is conformally deposited such that the metal contains minimal voids or defects that may increase gate resistance. In the current embodiment, cobalt is deposited by CVD or one of its variants including HDPCVD, MOCVD, RPCVD, and PECVD. Alternatively, the p-metal may be nickel, platinum or any other pure p-metal with low resistivity and a band edge work function. And the conformal process utilized may be ALD or any other process suitable to fill the openings without voids.

Figure 29:
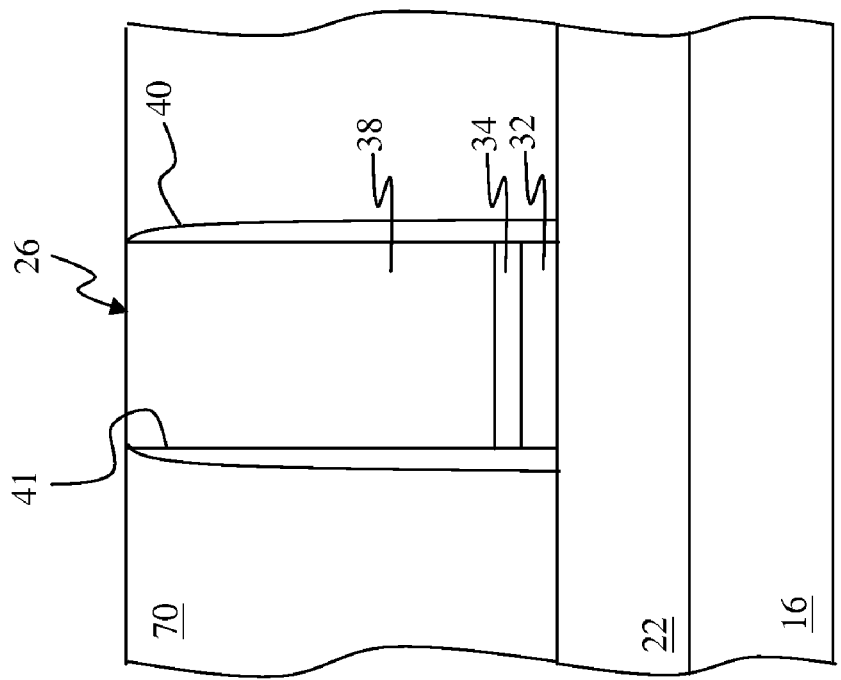
Figure 28:
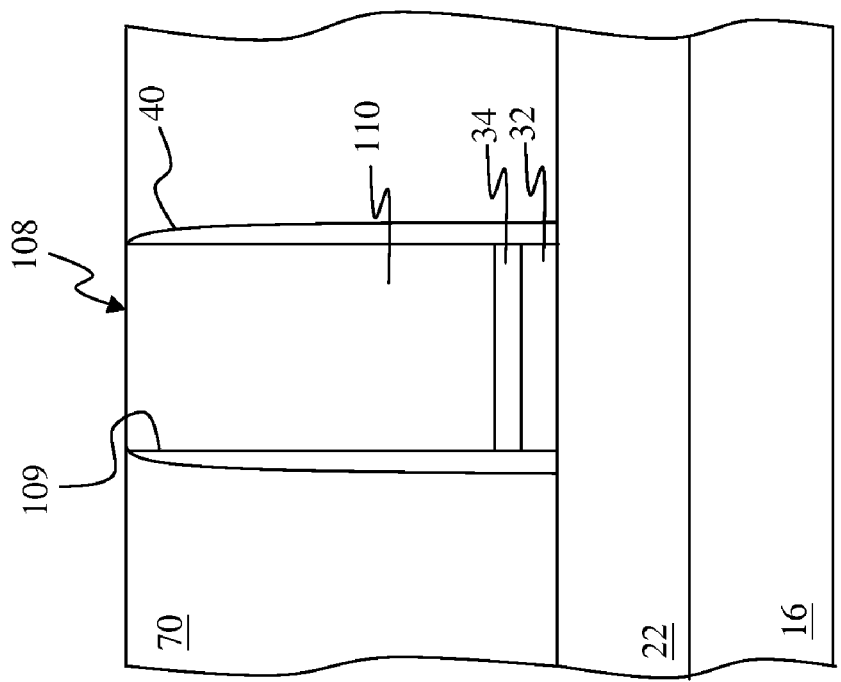

Referring now to FIGS. 28 and 29, a CMP is performed to remove portions of the p-metal 38 outside of the opening 41. The final gate structure 26 is thus formed. The photoresist layer 114 is also removed.

It is understood that the semiconductor device 106 will undergo further processing to complete fabrication. For example, a not-illustrated multilayer interconnection (MLI) including metal layers (e.g., M1, M2, etc.) and inter-metal dielectric (IMD) will be formed above fin and gate structures 18, 20, 108, and 26 in order to electrically couple various device parts to form an integrated circuit. The multilayer interconnection includes vertical interconnects, such as conventional vias or contacts, and horizontal interconnects, such as metal lines. The various interconnection aspects may utilize various conductive materials including copper, tungsten and silicide. In one example, a damascene process is used to form copper multilayer interconnection structure.

Figure 30:
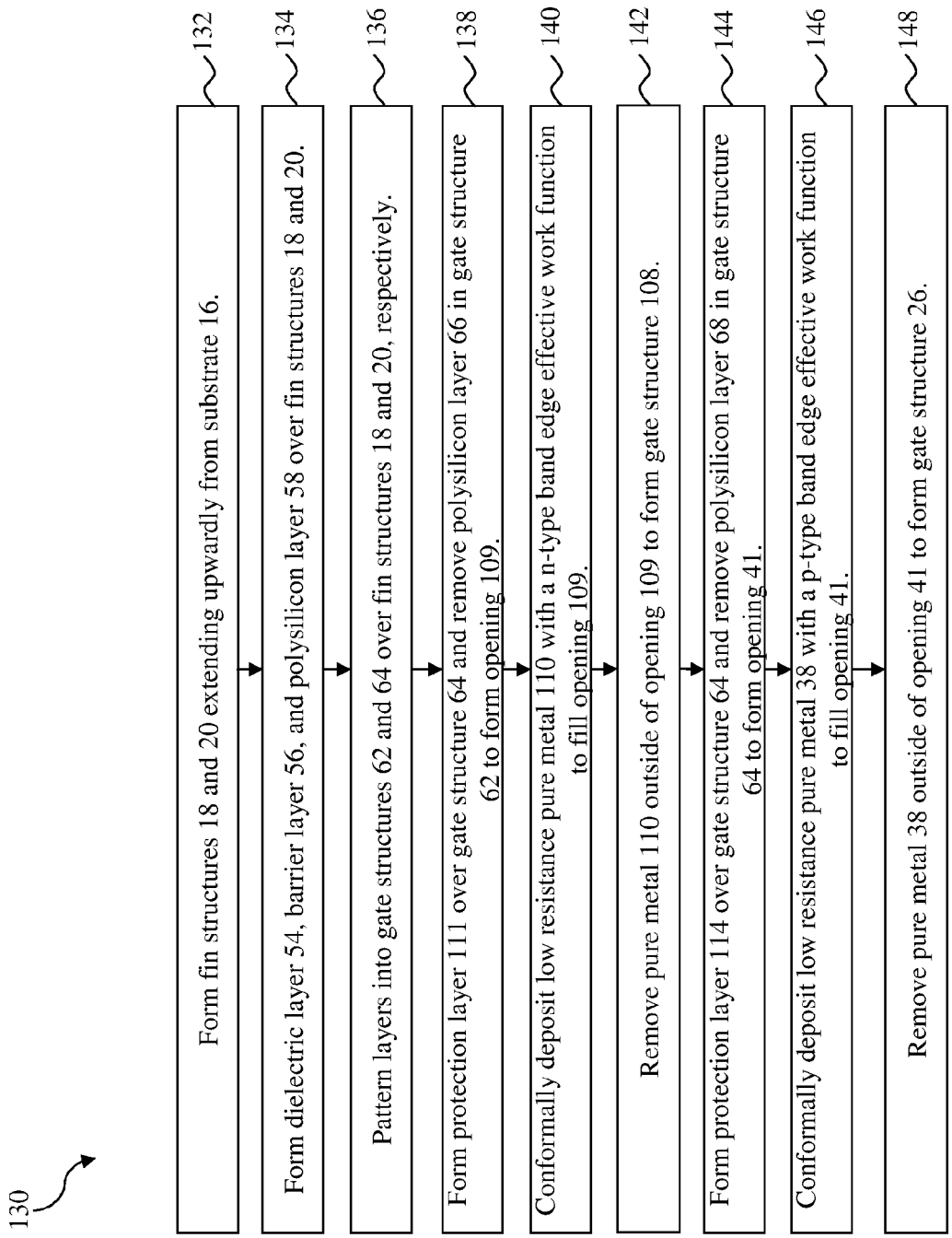
FIG. 30 is a high-level flowchart showing a process that is described in association with FIGS. 20-29.

FIG. 30 is a high-level flowchart showing the fully gate last process 130 that was described above in association with FIGS. 20-29. Process 130 begins at block 132 where the fin structures 18 and 20 are formed from the substrate 16. The STI regions 22 are also formed after the fin structures are formed. The process 130 proceeds to block 134 where the dielectric layer 54, the barrier layer 56, and the polysilicon layer 58 are formed over the fin structures 18 and 20. Then, in block 136, the layers formed in block 134 are patterned into the interim gate structures 62 and 64. The interim gate structure 62 overlays the channel region 28 of the fin structure 18 and the interim gate structure 64 overlays the channel region 30 of the fin structure 20. Also, the ILD layer 70 is deposited over the semiconductor device 10 and a CMP is performed to expose the top portions of the gate structures 62 and 64. Process 130 proceeds to block 138 where the patterned photoresist layer 111 is formed over the interim gate structure 64 and the polysilicon layer 66 is completely removed to form the opening 109. Next, in block 140, the low resistance pure metal 110 with an n-type band edge effective work function is conformally deposited in the opening 109. Process 130 proceeds to block 142 where the pure n-metal 110 outside of the opening 109 is removed thereby forming a metal gate electrode in the gate structure 108. The photoresist layer 111 is then removed. Then, in block 144, the patterned photoresist layer 114 is formed over the gate structure 108 and the polysilicon layer 68 in the interim gate structure 64 is completely removed to form the opening 41. Next, in block 146, the low resistance pure metal 38 with a p-type band edge effective work function is conformally deposited in the opening 41. Finally, process 130 proceeds to block 148 where the p-metal 38 outside of the opening 41 is removed thereby forming a metal gate electrode in the gate structure 26. The photoresist layer 114 is then removed.

The fully gate last process depicted in FIGS. 20-29 is not limited to the aspects of the process described above. For example, the polysilicon material may be removed simultaneously from the interim gate structures 62 and 64. Further, the openings 109 and 41 may be formed sequentially and the sequence of PMOS and NMOS FinFET formation may be reversed. Also, as described above, if the FinFETs 107 and 14 are long-channel devices, an additional step may be used to complete formation of the metal gate electrodes in the gate structures. Specifically, a conductive fill metal such as aluminum may be deposited to fill the remainder of openings 109 and 41.

Furthermore, the semiconductor devices 10 and 106 are not limited to the aspects and structure of the integrated circuit described above. For example, the gate structures may be spaced apart and thus electrically isolated. Further, the integrated circuits in the semiconductor devices 10 and 106 can also include passive components such as resistors, capacitors, inductors, and/or fuses; and active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate;
   forming first and second projections extending upwardly from the substrate, the projections having respective first and second channel regions therein;
   forming a first structure engaging the first projection adjacent the first channel region, the first structure including:
      a first dielectric material over the first channel region;
      a non-metallic conductive layer over the first dielectric material; and
      a first opening over the conductive layer;
   forming a second structure engaging the second projection adjacent the second channel region, the second structure including:
      a second dielectric material over the second channel region; and
      a second opening larger than the first opening, the second opening being over the second dielectric material and the second channel region; and
   conformally depositing a pure metal with a low resistivity in the first and second openings.

2. A method according to claim 1, wherein the conformally depositing fills the first and second openings with the pure metal.

3. A method according to claim 1, including heating the first structure to form a silicide from the metal in the first opening and at least a portion of the non-metallic conductive layer.

4. A method according to claim 1,
   wherein the forming the first structure includes:
      depositing the first dielectric material over the first channel region;
      depositing the conductive layer over the first dielectric material;
      forming a protection layer over the second structure; and
      removing a portion of the conductive layer over the first channel region; and
   wherein the forming the second structure includes:
      depositing the second dielectric material over the second channel region;
      depositing a dummy electrode over the second dielectric material;
      forming a protection layer over the first structure; and
      removing the dummy electrode.

5. A method according to claim 1, wherein the conformally depositing includes selecting as the pure metal a metal with a band edge p-type work function value.

6. A method according to claim 5, wherein the conformally depositing includes selecting as the pure metal one of cobalt (Co), nickel (Ni), and platinum (Pt).

7. A method according to claim 5, wherein forming the first structure includes doping the non-metallic conductive layer to have an n-type work function value.

8. A method according to claim 1,
   wherein the second channel region is a long channel region;
   wherein the conformally depositing fills a portion of the second opening with the pure metal; and
   including depositing a fill metal in a remaining portion of the second opening.

9. A method comprising:
   providing a substrate;
   forming first and second projections extending upwardly from the substrate, the projections having respective first and second channel regions therein;
   forming a first structure engaging the first projection adjacent the first channel region, the first structure including:
      a first dielectric material over the first channel region; and
      a first opening over the first dielectric material and the first channel region;
   forming a second structure engaging the second projection adjacent the second channel region, the second gate structure including:
      a second dielectric material over the second channel region; and
      a second opening over the second dielectric material and the second channel region;

conformally depositing a pure first metal with an n-type work function value and a low resistivity in the first opening; and conformally depositing a pure second metal with a p-type work function value and a low resistivity in the second opening.

10. A method according to claim 9, wherein the conformally depositing the pure first metal includes filling the first opening with the first metal; and wherein the conformally depositing the pure second metal includes filling the second opening with the second metal.

11. A method according to claim 9, wherein the forming the first structure includes:

depositing the first dielectric material over the first channel region;

depositing a first dummy electrode over the first dielectric material;

forming a protection layer over the second structure; and removing the first dummy electrode; and wherein the forming the second structure includes:

depositing the second dielectric material over the second channel region;

depositing a second dummy electrode over the second dielectric material;

forming a protection layer over the first structure; and removing the second dummy electrode.

12. A method according to claim 9, wherein the conformally depositing the pure first metal is carried out by depositing one of aluminum (Al) and tantalum (Ta).

13. A method according to claim 9, wherein the conformally depositing the pure second metal is carried out by depositing one of cobalt (Co), nickel (Ni), and platinum (Pt).

14. A method according to claim 9, wherein the first and second channel regions are long channel regions;

wherein the conformally depositing the pure first metal fills a portion of the first opening;

wherein the conformally depositing the pure second metal fills a portion of the second opening; and including depositing a fill metal in remaining portions of the first and second openings.

* * * * *